(12) United States Patent
Greenlee et al.

(10) Patent No.: US 11,856,764 B2
(45) Date of Patent: *Dec. 26, 2023

(54) MEMORY ARRAYS COMPRISING STRINGS OF MEMORY CELLS AND METHODS USED IN FORMING A MEMORY ARRAY COMPRISING STRINGS OF MEMORY CELLS

(71) Applicant: Micron Technology, Inc., Boise, ID (US)

(72) Inventors: Jordan D. Greenlee, Boise, ID (US); John D. Hopkins, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 268 days.

This patent is subject to a terminal disclaimer.

(21) Appl. No.: 17/223,359

(22) Filed: Apr. 6, 2021

(65) Prior Publication Data
US 2022/0320129 A1  Oct. 6, 2022

(51) Int. Cl.
| H01L 21/00 | (2006.01) |
| H10B 41/27 | (2023.01) |
| H01L 21/768 | (2006.01) |
| H10B 43/27 | (2023.01) |

(52) U.S. Cl.
CPC ....... *H10B 41/27* (2023.02); *H01L 21/76802* (2013.01); *H01L 21/76889* (2013.01); *H10B 43/27* (2023.02)

(58) Field of Classification Search
CPC ... H10B 41/27; H10B 43/27; H01L 21/76802; H01L 21/76889
See application file for complete search history.

(56) References Cited

U.S. PATENT DOCUMENTS

| 11,404,436 B2 * | 8/2022 | Greenlee ............... H10B 43/35 |
| 2017/0358362 A1 | 12/2017 | Lee |
| 2018/0006052 A1 | 1/2018 | Hwang |

(Continued)

FOREIGN PATENT DOCUMENTS

| CN | 111295756 | 6/2020 |
| WO | WO 2020/149911 | 7/2020 |
| WO | WO PCT/US2022/016460 | 5/2022 |

*Primary Examiner* — Reema Patel
(74) *Attorney, Agent, or Firm* — Wells St. John P.S.

(57) ABSTRACT

A method used in forming a memory array comprising strings of memory cells comprises forming a conductor tier comprising conductor material on a substrate. Laterally-spaced memory-block regions are formed that individually comprise a vertical stack comprising alternating first tiers and second tiers directly above the conductor tier. Channel-material strings of memory cells extend through the first tiers and the second tiers. Horizontally-elongated lines are formed in the conductor tier between the laterally-spaced memory-block regions. The horizontally-elongated lines are of different composition from an upper portion of the conductor material and comprise metal material. After the horizontally-elongated lines are formed, conductive material is formed in a lower of the first tiers and that directly electrically couples together the channel material of individual of the channel-material strings and the conductor material of the conductor tier. Other embodiments, including structure independent of method, are disclosed.

21 Claims, 10 Drawing Sheets

(56) References Cited

U.S. PATENT DOCUMENTS

2020/0235112 A1 7/2020 Howder et al.
2020/0402890 A1 12/2020 Chary et al.
2021/0257386 A1 8/2021 Wang et al.

* cited by examiner

MEMORY ARRAYS COMPRISING STRINGS OF MEMORY CELLS AND METHODS USED IN FORMING A MEMORY ARRAY COMPRISING STRINGS OF MEMORY CELLS

TECHNICAL FIELD

Embodiments disclosed herein pertain to memory arrays and to methods used in forming a memory array.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

Memory arrays may be arranged in memory pages, memory blocks and partial blocks (e.g., sub-blocks), and memory planes, for example as shown and described in any of U.S. Patent Application Publication Nos. 2015/0228651, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

DETAILED DESCRIPTION OF EXAMPLE EMBODIMENTS

Embodiments of the invention encompass methods used in forming a memory array, for example an array of NAND or other memory cells that may have at least some peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. Embodiments of the invention also encompass a memory array (e.g., NAND architecture) independent of method of manufacture. First example method embodiments are described with reference to FIGS. 1-23 which may be considered as a "gate-last" or "replacement-gate" process, and starting with FIGS. 1 and 2.

Figure 1:
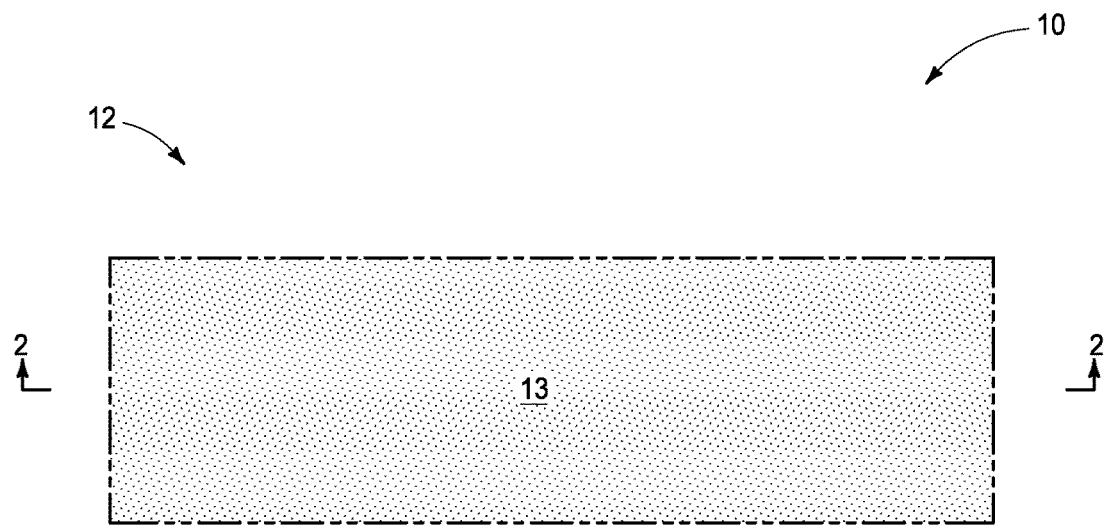
FIG. 1 is a diagrammatic cross-sectional view of a portion of a substrate in process in accordance with an embodiment of the invention and is taken through line 1-1 in FIG. 2.
Figure 2:
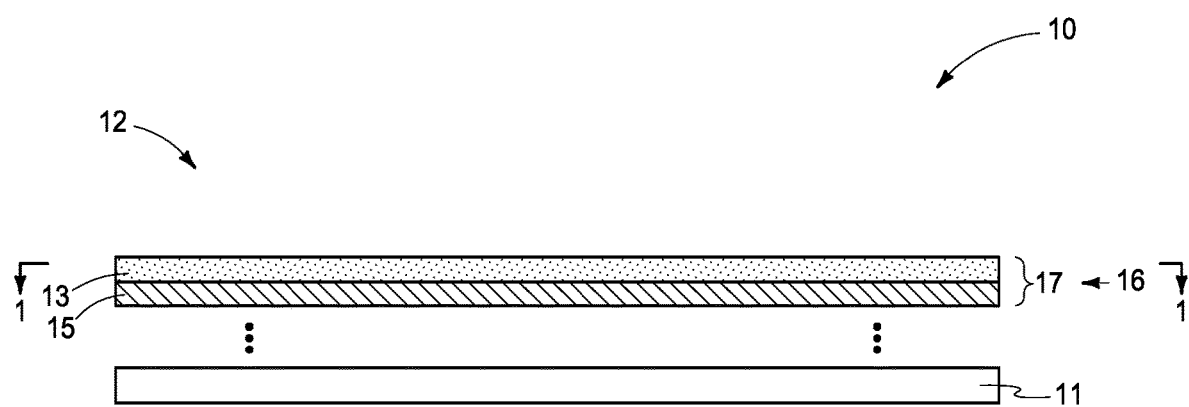
FIG. 2 is a diagrammatic cross-sectional view taken through line 2-2 in FIG. 1.

FIGS. 1 and 2 show a construction 10 having an array or array area 12 in which elevationally-extending strings of transistors and/or memory cells will be formed. Construction 10 comprises a base substrate 11 having any one or more of conductive/conductor/conducting, semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1 and 2-depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

A conductor tier 16 comprising conductor material 17 has been formed above substrate 11. In one embodiment, conductor material 17 comprises conductor material 13 (e.g., conductively-doped semiconductive material, such as polysilicon) atop (directly above, and e.g., directly against) metal material 15 (e.g., $WSi_x$). Conductor tier 16 may comprise part of control circuitry (e.g., peripheral-under-array circuitry and/or a common source line or plate) used to control read and write access to the transistors and/or memory cells that will be formed within array 12.

Figure 3:
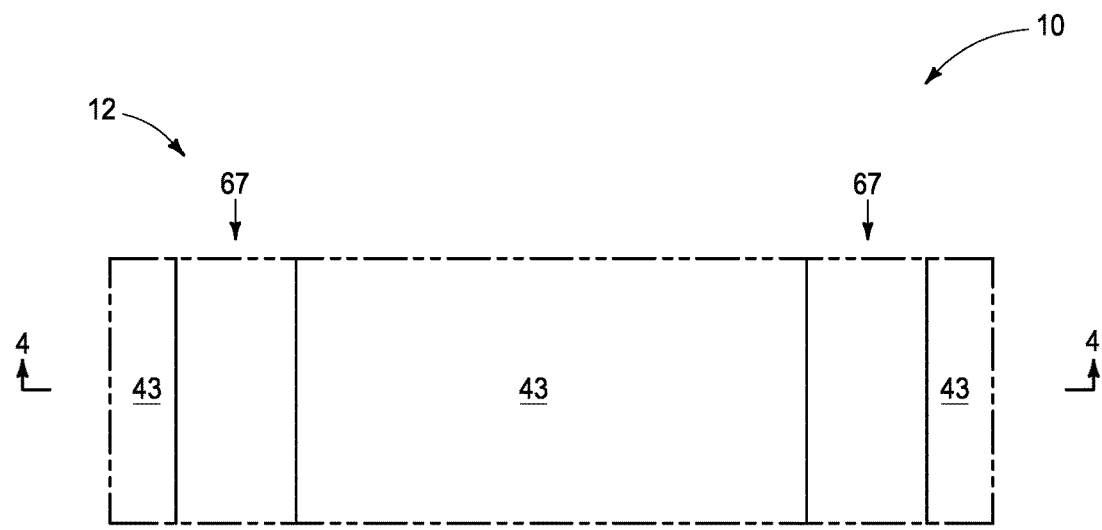
FIGS. 3-23 are diagrammatic sequential sectional, expanded, enlarged, and/or partial views of the construction of FIGS. 1 and 2, or portions thereof, in process in accordance with some embodiments of the invention.
Figure 4:
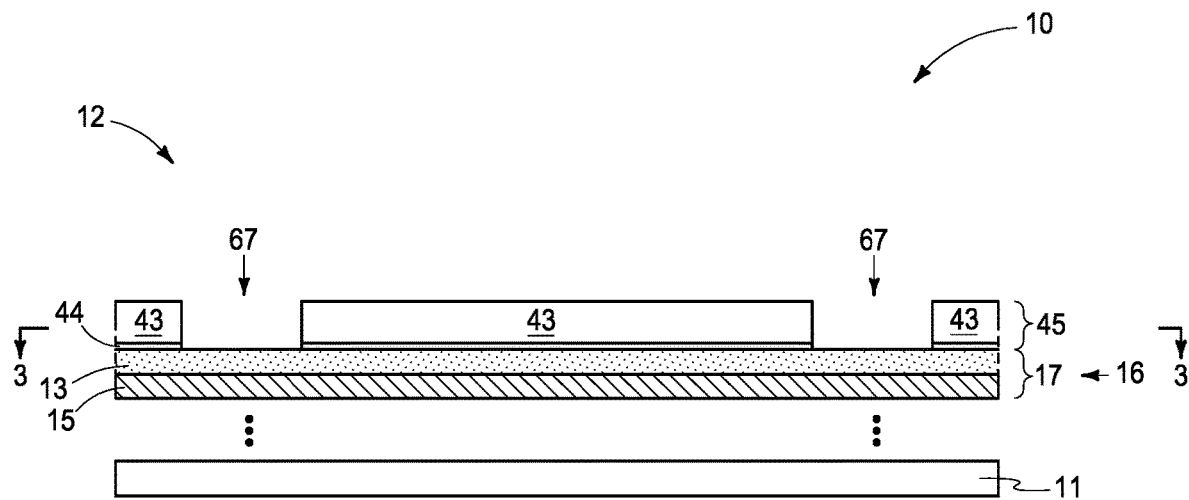

Referring to FIGS. 3 and 4, and in one embodiment, masking material 45 has been formed directly above conductor tier 16. In one such embodiment, masking material 45 comprises silicon dioxide (e.g., 44) and in one embodiment comprises photoresist (e.g., 43 above silicon dioxide 44). Line-openings 67 have been formed through masking material 45, with individual of line openings 67 having a longitudinal outline corresponding to that of individual of horizontally-elongated lines to be formed in conductor tier 16 (not yet shown).

Figure 5:
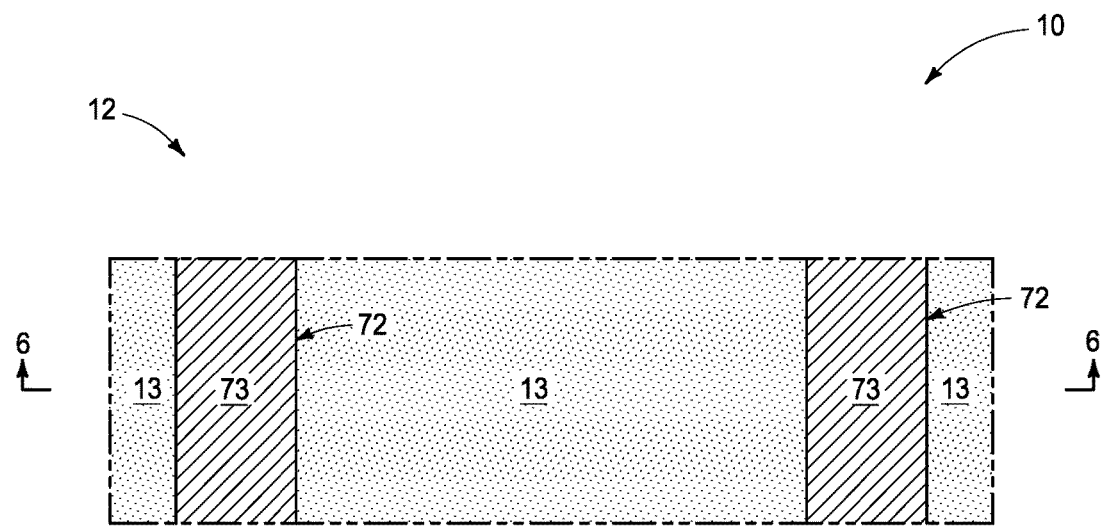
Figure 6:
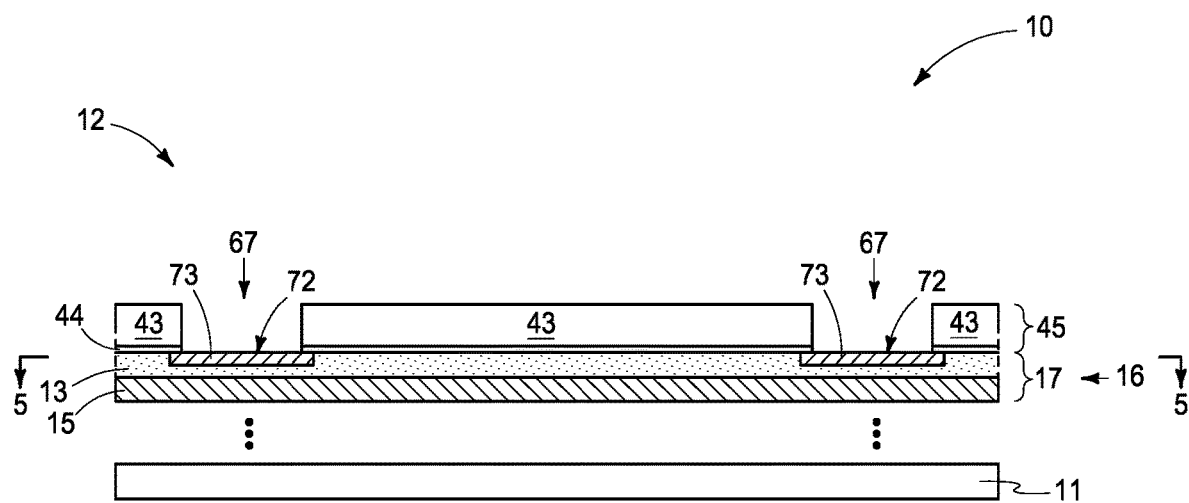

Referring to FIGS. 5 and 6, horizontally-elongated lines 72 have been formed in conductor tier 16 between what will comprise laterally-spaced memory-block regions thereabove (not-yet-shown). Horizontally-elongated lines 72 are of different composition from an upper portion of conductor material 17 and comprise metal material 73. In one embodiment and as shown, horizontally-elongated lines 72 are not as vertically thick as conductor tier 16 and in one such embodiment are not as vertically thick as conductor material 13. Alternately, metal material 73 may extend completely through material 13, including completely through conductor tier 16 (neither of which is shown). Regardless, in one embodiment, horizontally-elongated lines 72 are conductive. In one embodiment, horizontally-elongated lines 72 extend laterally into areas of memory-block regions that will be there-above (not yet shown).

In one embodiment, metal material 73 comprises an elemental-form metal. In one such embodiment, the elemental-form metal may be formed by a process comprising chemical vapor deposition using a metal halide wherein the metal thereof comprises the metal of the elemental-form metal. By way of examples only, a temperature range is 200° C. to 500° C., a pressure range is 1 mTorr to atmospheric pressure, and a deposition time range is 1 second to 5 minutes. For example, elemental tungsten can be deposited at about 300° C. and 10 mTorr using $WF_6$ as a deposition precursor where conductively-doped semiconductive material 13 at least predominately comprises silicon.

In one embodiment, metal material 73 comprises a metal silicide. In one such example embodiment, an upper portion of conductor material 17 comprises silicon and the forming of the metal silicide occurs by a process comprising depositing an elemental-form metal against the upper portion of conductor material 17, followed by annealing of the elemental-form metal and the silicon to form the metal silicide 73.

Figure 7:
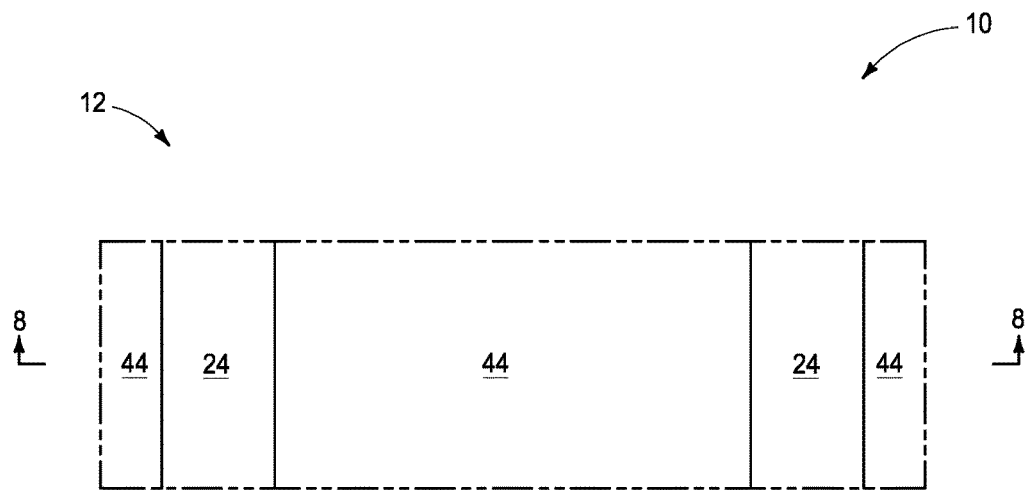
Figure 8:
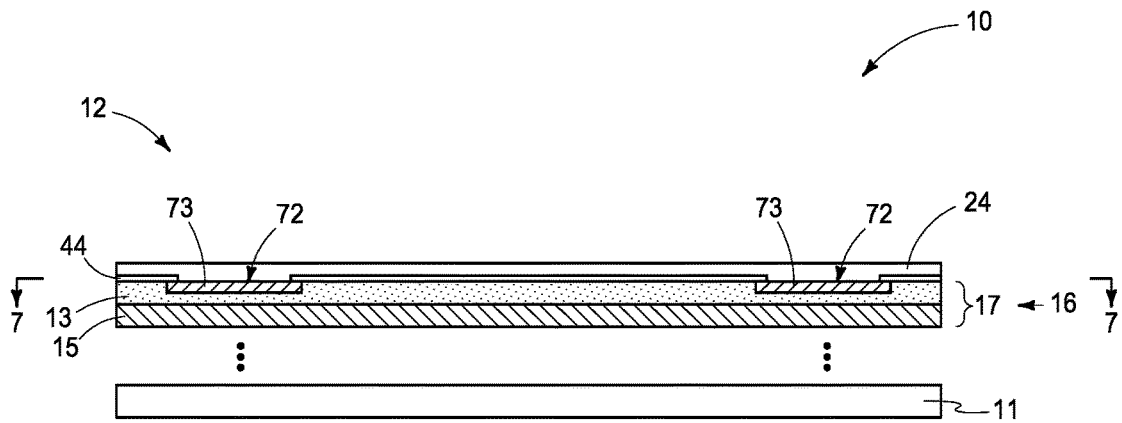
Figure 9:
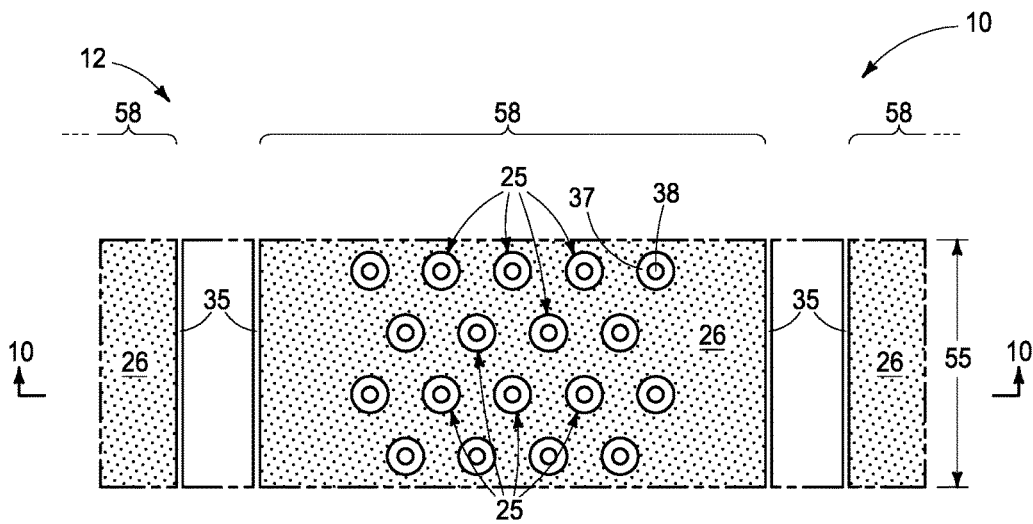

Referring to FIGS. 7 and 8, example photoresist 43 (not shown) has been removed and horizontally-elongated lines 72 thereafter have been masked with insulative material 24 (e.g., a silicon oxide such as silicon dioxide). Silicon dioxide 44 may be removed prior to forming insulative material 24 (not shown). Insulative material 24 may be provided to inhibit later possible corrosion of conductively-doped semiconductive material 13. Regardless, if formed, insulative material 24 is ideally deposited in a manner that does not appreciably oxidize metal material 73. As an example, a silicon oxide insulative material 24 can be deposited using a silane and oxygen-containing gas that is at least initially silane-rich (e.g., more silane than is stoichiometrically necessary to form $SiO_2$ if forming $SiO_2$) at 300° C. to 700° C. at 1 mTorr to 1 atmosphere.

Referring to FIGS. 9, 10, 12, and 13, a stack 18 comprising vertically-alternating insulative tiers 20* and conductive tiers 22* has been formed above conductor tier 16 (an * being used as a suffix to be inclusive of all such same-numerically-designated components that may or may not have other suffixes). Example thickness for each of tiers 20* and 22* is 22 to 60 nanometers. Only a small number of tiers 20* and 22* is shown, with more likely stack 18 comprising dozens, a hundred or more, etc. of tiers 20* and 22*. Insulative materials 24 and/or 44 as shown in FIGS. 7 and 8 (when present) may be considered as a lowest insulative tier 20z and may be sacrificial. Regardless, other circuitry that may or may not be part of peripheral and/or control circuitry may be between conductor tier 16 and stack 18. For example, multiple vertically-alternating tiers of conductive material and insulative material of such circuitry may be below a lowest of the conductive tiers 22* and/or above an uppermost of the conductive tiers 22*. For example, one or more select gate tiers (not shown) may be between conductor tier 16 and the lowest conductive tier 22* and one or more select gate tiers may be above an uppermost of conductive tiers 22*. Alternately or additionally, at least one of the depicted uppermost and lowest conductive tiers 22* may be a select gate tier. Regardless, conductive tiers 22* (alternately referred to as first tiers) may not comprise conducting material and insulative tiers 20* (alternately referred to as second tiers) may not comprise insulative material or be insulative at this point in processing in conjunction with the hereby initially-described example method embodiment which is "gate-last" or "replacement-gate". Example conductive tiers 22* comprise first material 26 (e.g., silicon nitride) which may be wholly or partially sacrificial. Example insulative tiers 20* comprise second material 24 (e.g., silicon dioxide) that is of different composition from that of first material 26 and which may be wholly or partially sacrificial.

A lowest 22z of first tiers 22* is directly above (e.g., directly against) lowest second tier 20z. Lowest first tier 22z comprises sacrificial material 77 and that may comprise any suitable insulative, conductive, and/or semiconductive material. In a couple of ideal embodiments, sacrificial material 77 comprises polysilicon or silicon nitride. In one embodiment, a next-lowest 20x of second tiers 20* is directly above lowest first tier 22z (e.g., comprising material 24). In one embodiment, a conducting-material tier 21 comprising conducting material 47 (e.g., conductively-doped polysilicon) is directly above next-lowest second tier 20x.

Channel openings 25 have been formed (e.g., by etching) through insulative tiers 20* and conductive tiers 22* to conductor tier 16. Channel openings 25 may taper radially-inward (not shown) moving deeper in stack 18. In some embodiments, channel openings 25 may go into conductor material 17 of conductor tier 16 as shown or may stop there-atop (not shown). Alternately, as an example, channel openings 25 may stop atop or within the lowest insulative tier 20. A reason for extending channel openings 25 at least to into conductor material 17 of conductor tier 16 is to provide and anchoring effect to material that is within channel openings 25. Etch-stop material (not shown) may be within or atop conductor material 17 of conductor tier 16 to facilitate stopping of the etching of channel openings 25 relative to conductor tier 16 when such is desired. Such etch-stop material may be sacrificial or non-sacrificial.

Horizontally-elongated trenches 40 have been formed (e.g., by anisotropic etching) into stack 18 to form laterally-spaced memory-block regions 58. Horizontally-elongated trenches 40 are individually directly above individual horizontally-elongated lines 72 in conductor tier 16 and extend to sacrificial material 77. Horizontally-elongated lines 72 may be formed before or after forming vertical stack 18. By way of example and for brevity only, channel openings 25 are shown as being arranged in groups or columns of staggered rows of four and five channel openings 25 per row and being arrayed in laterally-spaced memory-block regions 58 that will comprise laterally-spaced memory blocks 58 in a finished circuitry construction. In this document, "block" is generic to include "sub-block". Trenches 40 will typically be wider than channel openings 25 (e.g., 10 to 20 times wider, yet such wider degree not being shown for brevity). Memory-block regions 58 and resultant memory blocks 58 (not yet shown) may be considered as being longitudinally elongated and oriented, for example along a direction 55. Any alternate existing or future-developed arrangement and construction may be used.

As one example, trenches 40 may initially be formed by etching materials 24, 26, and 47 (likely using different anisotropic etching chemistries) and that stops on or within material 24 of next-lowest second tier 20x (when present). A thin sacrificial liner 35 (e.g., polysilicon, hafnium oxide, aluminum oxide, etc.) may optionally be formed, followed by punch-etching there-through to expose material 24, and followed by punch-etching through material 24 to expose sacrificial material 77. Alternately, and by way of example only, a sacrificial etch-stop line (not shown) having the same general horizontal outline as trenches 40 may individually be formed in conducting tier 21 (when present) directly above and in contact with material 24 of next-lowest second tier 20x before forming other materials of stack 18 thereabove. Trenches 40 may then be formed by etching materials 24 and 26 to stop on or within the material of the individual sacrificial etch-stop lines, followed by exhuming remaining material of such lines prior to optional forming of thin sacrificial liner 35.

Figure 10:
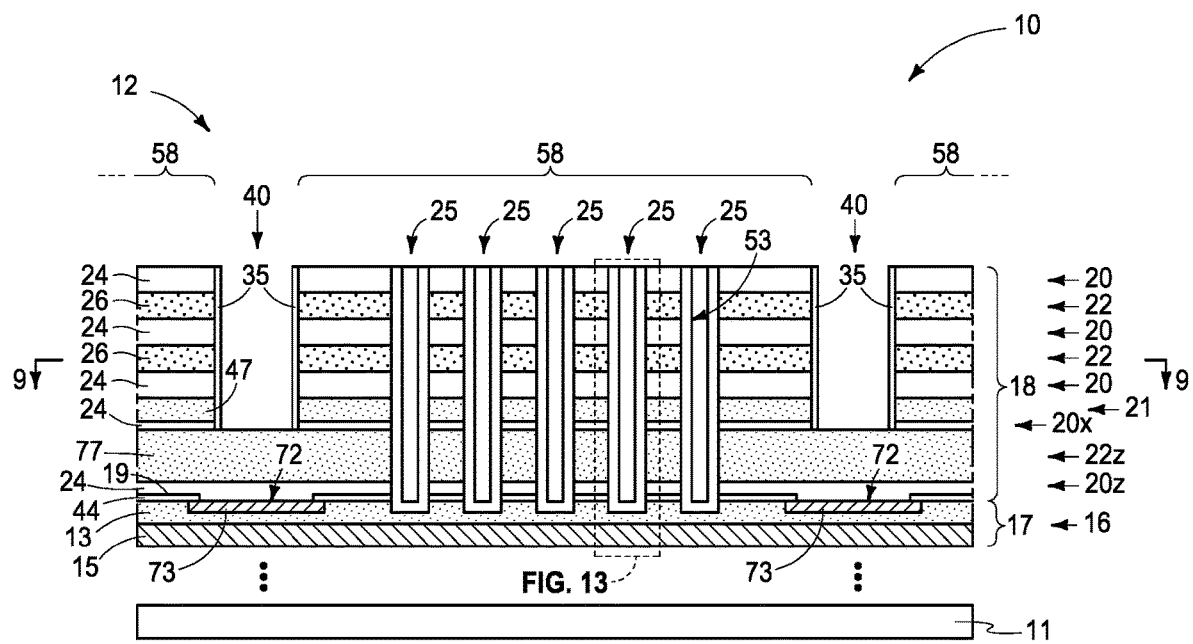
Figure 11:
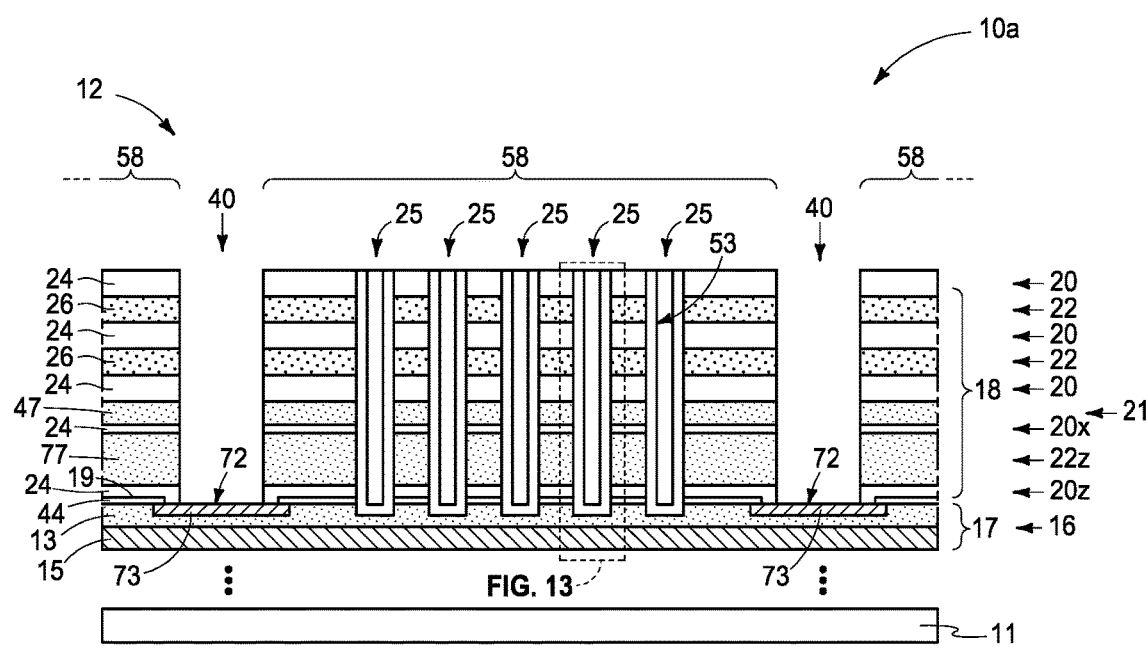
Figure 12:
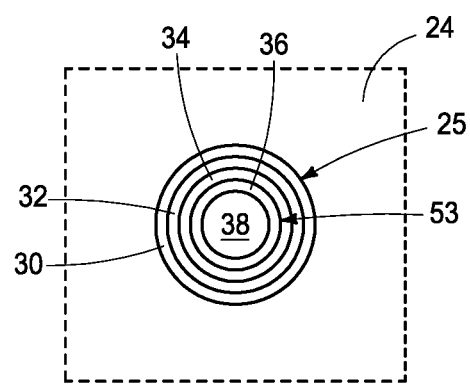
Figure 13:
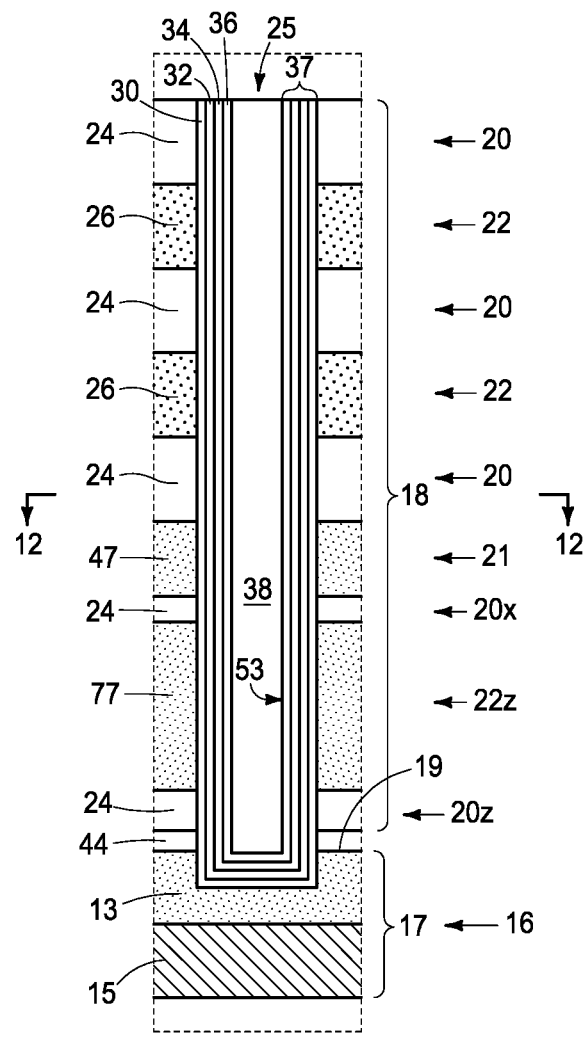

FIG. 10 shows an ideal and intended processing as just-described where the etching to form trenches 40 has stopped on or near the top of sacrificial material 77. However, and not intended, an over-etch may occur whereby trenches 40 extend to conductor material 13 of conductor tier 16. This can be problematic, particularly when later etching sacrificial material 77 if materials 13 and 77 are of the same etchable composition. Presence of horizontally-elongated lines 72 may preclude such undesired etching. For example, FIG. 11 shows an alternate construction 10a (e.g., an alternate outcome) where trenches 40 extend downwardly to horizontally-elongated lines 72, with such lines 72 in such instance eliminating or at least reducing degree of conductor material 13 being etched when sacrificial material 77 is later etched.

Transistor channel material may be formed in the individual channel openings elevationally along the insulative tiers and the conductive tiers, thus comprising individual channel-material strings, which is directly electrically coupled with conductive material in the conductor tier. Individual memory cells of the example memory array being formed may comprise a gate region (e.g., a control-gate region) and a memory structure laterally-between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally-between the channel material and the storage material.

FIGS. 9-13 show one embodiment wherein charge-blocking material 30, storage material 32, and charge-passage material 34 have been formed in individual channel openings 25 elevationally along insulative tiers 20* and conductive tiers 22*. Transistor materials 30, 32, and 34 (e.g., memory-cell materials) may be formed by, for example, deposition of respective thin layers thereof over stack 18 and within individual openings 25 followed by planarizing such back at least to a top surface of stack 18.

Channel material 36 has also been formed in channel openings 25 elevationally along insulative tiers 20* and conductive tiers 22*, thus comprising individual operative channel-material strings 53 in channel openings 25. Channel material 36 may be considered as having a lowest surface thereof. Channel-material strings 53 in one embodiment have memory-cell materials (e.g., 30, 32, and 34) therealong and with second-tier material (e.g., 24) being horizontally-between immediately-adjacent channel-material strings 53. Materials 30, 32, 34, and 36 are collectively shown as and only designated as material 37 in FIGS. 1 and 2 due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted to remove materials 30, 32, and 34 from the bases of channel openings 25 (not shown) to expose conductor tier 16 such that channel material 36 is directly against conductor material 17 of conductor tier 16. Such punch etching may occur separately with respect to each of materials 30, 32, and 34 (as shown) or may occur with respect to only some (not shown). Alternately, and by way of example only, no punch etching may be conducted and channel material 36 may be directly electrically coupled to conductor material 17 of conductor tier 16 only by a separate conductive interconnect (not yet shown). Channel openings 25 are shown as comprising a radially-central solid dielectric material 38 (e.g., spin-on-dielectric, silicon dioxide, and/or silicon nitride). Alternately, and by way of example only, the radially-central portion within channel openings 25 may include void space(s) (not shown) and/or be devoid of solid material (not shown).

Figure 14:
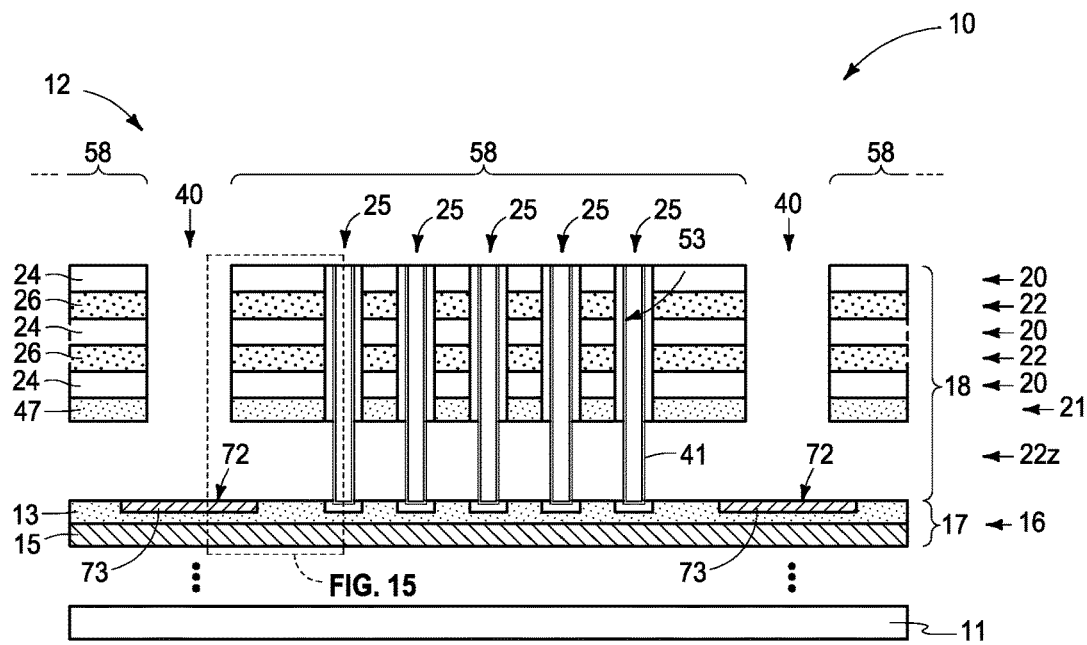
Figure 15:
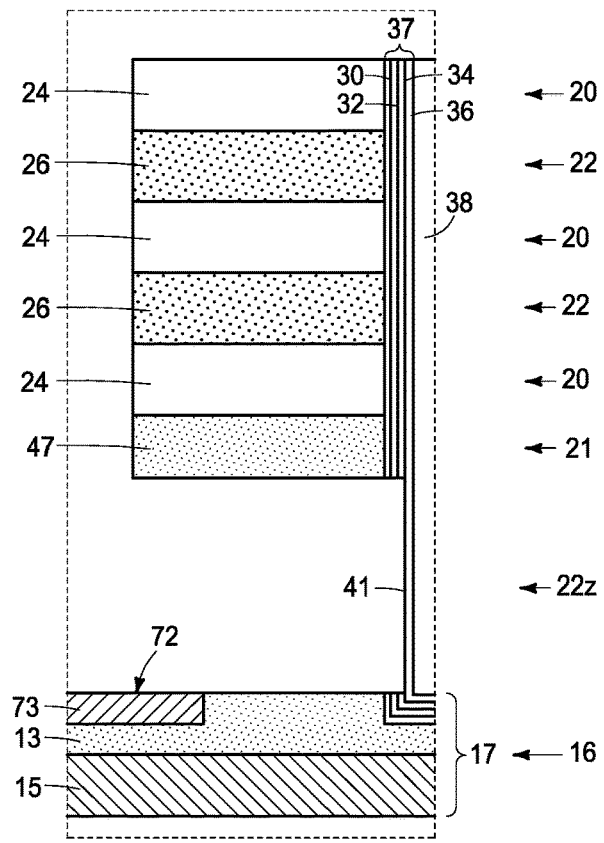

Referring to FIGS. 14 and 15, sacrificial material 77 (not shown) has been isotropically etched from lowest first tier 22z through trenches 40 (e.g., using liquid or vapor $H_3PO_4$ as a primary etchant where material 77 is silicon nitride or using tetramethyl ammonium hydroxide [TMAH] where material 77 is polysilicon). In one embodiment and as shown, after such isotropically etching, second-tier material 24 of lowest second tier 20z is etched (tier 20z and material 24 thereof thereby no longer being shown) to expose an upper surface of conductor material 13 of conductor tier 16 and a sidewall 41 of channel material 36 of channel-material strings 53 in lowest first tier 22z. Material 24 of tier 20x may also be etched as shown (tier 20x and material 24 thereof thereby no longer being shown). FIGS. 14 and 15 show example processing where, in one embodiment, material 30 (e.g., silicon dioxide), material 32 (e.g., silicon nitride), and material 34 (e.g., silicon dioxide or a combination of silicon dioxide and silicon nitride) have been etched in each of tiers 22z, 20x, and 20z to expose sidewall 41 of channel material 36 of channel-material strings 53 in tier 22z. Any of materials 30, 32, and 34 in tier 22z may be considered as being sacrificial material therein.

As an example, consider an embodiment where liner 35 (FIG. 10) is present and is one or more insulative oxides (other than silicon dioxide) and memory-cell materials 30, 32, and 34 individually are one or more of silicon dioxide and silicon nitride layers. In such example, the depicted construction can result by using modified or different chemistries for sequentially etching silicon dioxide and silicon nitride selectively relative to the other. As examples, a solution of 100:1 (by volume) water to HF will etch silicon dioxide selectively relative to silicon nitride, whereas a solution of 1000:1 (by volume) water to HF will etch silicon nitride selectively relative to silicon dioxide. Accordingly, and in such example, such etching chemistries can be used in an alternating manner where it is desired to achieve the example construction shown by FIGS. 14 and 15. The artisan is capable of selecting other chemistries for etching other different materials where a construction as shown in FIGS. 14 and 15 is desired (regardless of presence of liner 35).

Figure 16:
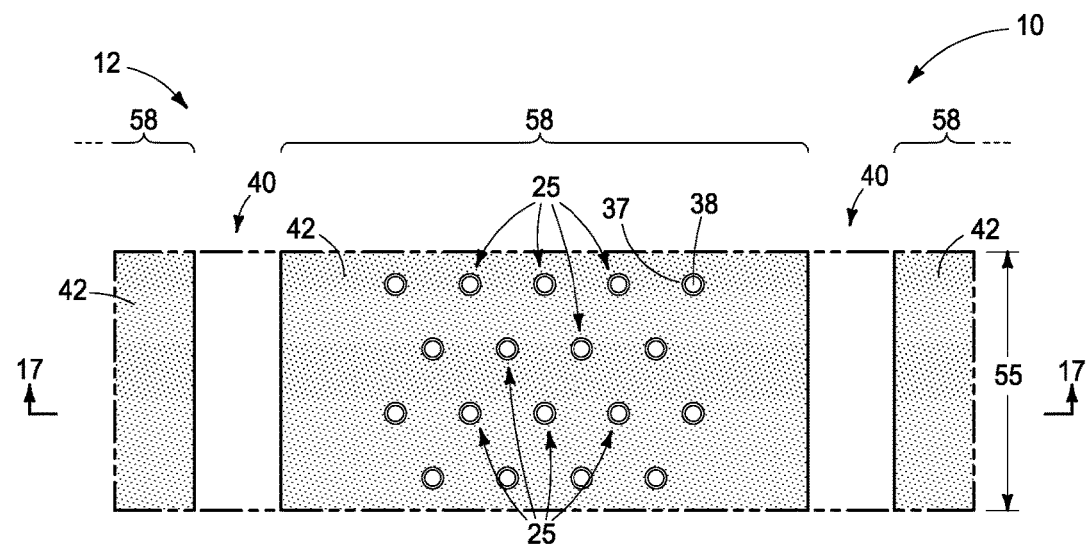
Figure 17:
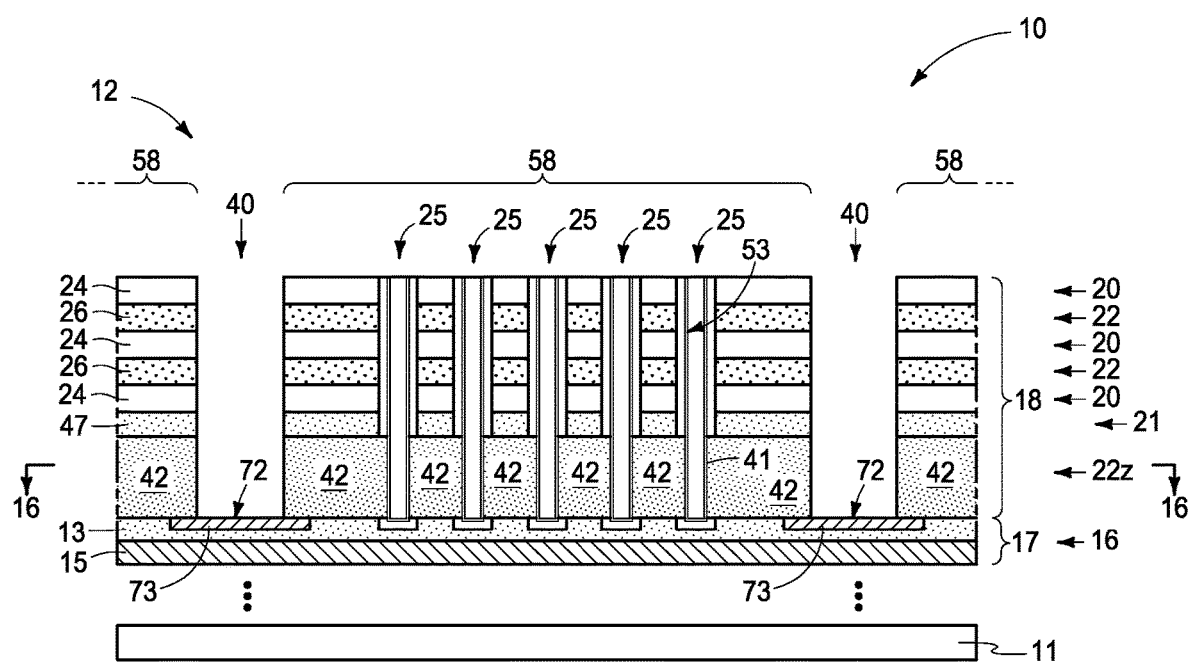
Figure 18:
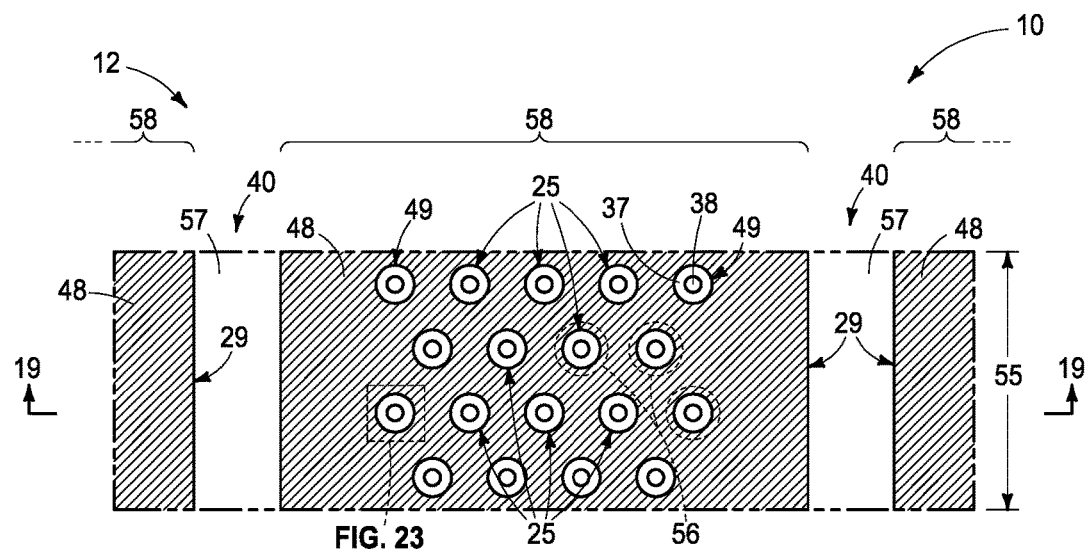
Figure 19:
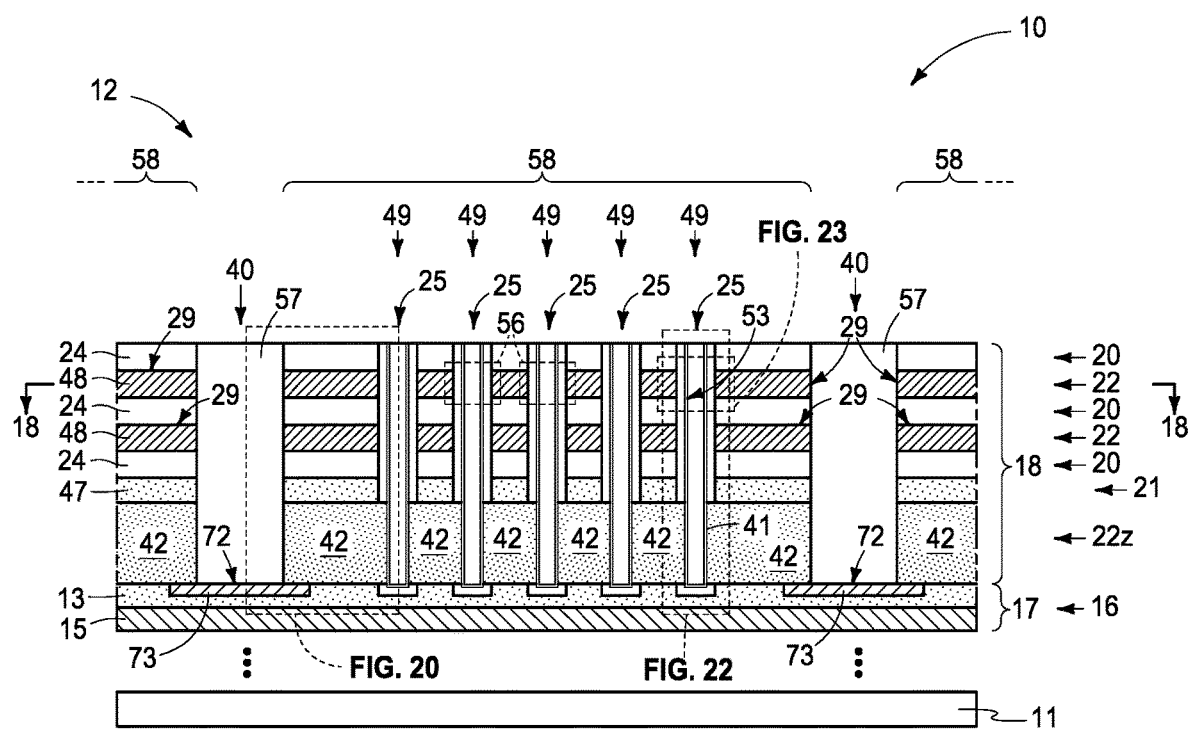
Figure 20:
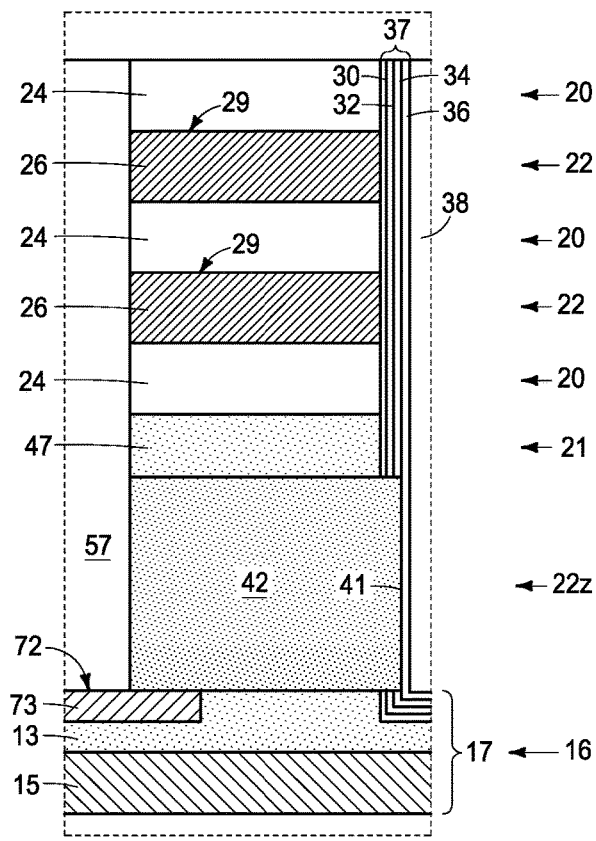
Figure 23:
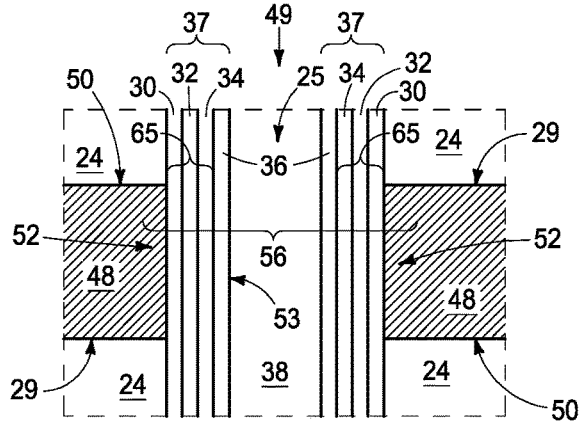
Figure 21:
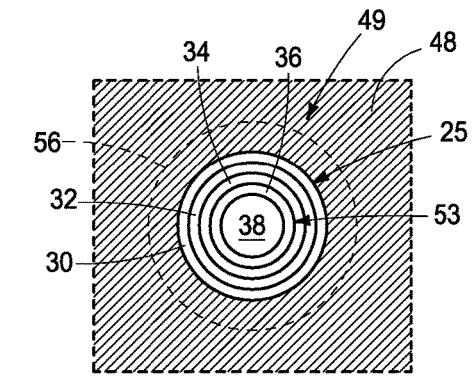
Figure 22:
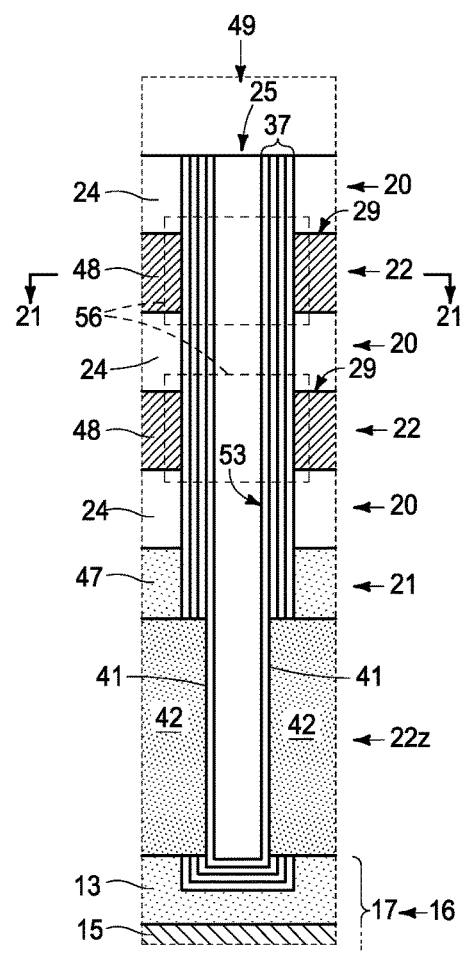

Referring to FIGS. 16 and 17, conductive material 42 (e.g., conductively-doped polysilicon) has been formed in lowest first tier 22z and that directly electrically couples together channel material 36 of individual operative channel-material strings 53 and conductor material 17 of conductor tier 16. Thereafter and as shown, and by way of example, conductive material 42 has been removed from trenches 40. Sacrificial liner 35 (not shown), when present (e.g., FIG. 10), may be removed before or after forming conductive material 42.

Referring to FIGS. 18-23, material 26 (not shown) of conductive tiers 22* has been removed, for example by being isotropically etched away through trenches 40 ideally selectively relative to the other exposed materials (e.g., using liquid or vapor $H_3PO_4$ as a primary etchant where material 26 is silicon nitride and other materials comprise one or more oxides or polysilicon). Material 26 (not shown) in conductive tiers 22* in the example embodiment is sacrificial and has been replaced with conducting material 48, and which has thereafter been removed from trenches 40, thus forming individual conductive lines 29 (e.g., wordlines) and elevationally-extending strings 49 of individual transistors and/or memory cells 56.

A thin insulative liner (e.g., $Al_2O_3$ and not shown) may be formed before forming conducting material 48. Approximate locations of transistors and/or memory cells 56 are indicated with a bracket in FIG. 23 and some with dashed outlines in FIGS. 18, 19, 21, and 22, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 (FIG. 23) corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36. In one embodiment and as shown with respect to the example "gate-last" processing, conducting material 48 of conductive tiers 22* is formed after forming openings 25 and/or trenches 40. Alternately, the conducting material of the conductive tiers may be formed before forming channel openings 25 and/or trenches 40 (not shown), for example with respect to "gate-first" processing.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

In one embodiment and as shown, the lowest surface of channel material 36 of channel-material strings 53 is never directly against any of conductor material 17 of conductor tier 16. In one embodiment and as shown, conductive material 42 is directly against sidewalls 41 of channel-material strings 53.

Intervening material 57 has been formed in trenches 40 and thereby laterally-between and longitudinally-along immediately-laterally-adjacent memory blocks 58. Intervening material 57 may provide lateral electrical isolation (insulation) between immediately-laterally-adjacent memory blocks. Such may include one or more of insulative, semiconductive, and conducting materials and, regardless, may facilitate conductive tiers 22 from shorting relative one another in a finished circuitry construction. Example insulative materials are one or more of $SiO_2$, $Si_3N_4$, $Al_2O_3$, and undoped polysilicon. In this document, "undoped polysilicon" is polysilicon having from 0 atoms/cm$^3$ to $1 \times 10^{12}$ atoms/cm$^3$ of atoms of conductivity-increasing impurity. "Doped polysilicon" is polysilicon that has more than $1 \times 10^{12}$ atoms/cm$^3$ of atoms of conductivity-increasing impurity and "conductively-doped polysilicon" is polysilicon that has at least $1 \times 10^{18}$ atoms/cm$^3$ of atoms of conductivity-increasing impurity. Intervening material 57 may include through array vias (not shown).

Any other attribute(s) or aspect(s) as shown and/or described herein with respect to other embodiments may be used in the embodiments shown and described with reference to the above embodiments.

In one embodiment, a method used in forming a memory array (e.g., 12) comprising strings (e.g., 49) of memory cells (e.g., 56) comprises forming a conductor tier (e.g., 16) comprising conductor material (e.g., 17) on a substrate (e.g., 11). Laterally-spaced memory-block regions (e.g., 58) are formed that individually comprise a vertical stack (e.g., 18) comprising alternating first tiers and second tiers (e.g., 22, 20, respectively directly above the conductor tier). Channel-material strings (e.g., 53) of memory cells (e.g., 56) extend through the first tiers and the second tiers. Horizontally-elongated lines (e.g., 72) are formed in the conductor tier between the laterally-spaced memory-block regions. The horizontally-elongated lines are of different composition from an upper portion of the conductor material and comprise metal material (e.g., 73). After forming the horizontally-elongated lines, conductive material (e.g., 42) is formed in a lower (e.g., 22z) of the first tiers and that directly electrically couples together the channel material (e.g., 36) of individual of the channel-material strings and the conductor material of the conductor tier. Any other attribute(s) or aspect(s) as shown and/or described herein with respect to other embodiments may be used.

Alternate embodiment constructions may result from method embodiments described above, or otherwise. Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments.

In one embodiment, a memory array (e.g., 12) comprising strings (e.g., 49) of memory cells (e.g., 56) comprises a conductor tier (e.g., 16) comprising conductor material (e.g., 17). Laterally-spaced memory blocks (e.g., 58) individually comprise a vertical stack (e.g., 18*) comprising alternating insulative tiers (e.g., 20*) and conductive tiers (e.g., 22*) directly above the conductor tier. Channel-material strings (e.g., 53) of memory cells (e.g., 56) extend through the insulative tiers and the conductive tiers. Conducting material (e.g., 42) of a lower of the conductive tiers (e.g., 22z) directly electrically couples together the channel material (e.g., 36) of individual of the channel-material strings and the conductor material of the conductor tier. Intervening material (e.g., 57) is laterally-between and longitudinally-along immediately-laterally-adjacent of the memory blocks. The intervening material comprises insulating material. Horizontally-elongated lines (e.g., 72) are in an upper portion of the conductor tier between the laterally-spaced memory blocks. The horizontally-elongated lines are of different composition from an upper portion of the conductor material and comprises metal material. Any other attribute(s) or aspect(s) as shown and/or described herein with respect to other embodiments may be used.

In one embodiment, a memory array (e.g., 12) comprising strings (e.g., 49) of memory cells comprises a conductor tier (e.g., 16) comprising conductively-doped polysilicon (e.g., 13). Laterally-spaced memory blocks (e.g., 58) are included and individually comprise a vertical stack (e.g., 18*) comprising alternating insulative tiers (e.g., 20*) and conductive tiers (e.g., 22*) directly above the conductor tier. Channel-material strings (e.g., 53) of memory cells (e.g., 56) extend through the insulative tiers and the conductive tiers. A lowest of the conductive tiers (e.g., 22z) comprises conductively-doped polysilicon (e.g., 42) directly against the conductively-doped polysilicon of the conductor tier and directly against a sidewall (e.g., 41) of channel material (e.g., 36) of the channel-material strings in the lowest conductive tier. Intervening material (e.g., 57) is laterally-between and longitudinally-along immediately-laterally-adjacent of the memory blocks. The intervening material comprises insulating material. Horizontally-elongated lines (e.g., 72) are in an upper portion of the conductor tier between the laterally-spaced memory blocks. The horizontally-elongated lines comprise at least one of a metal silicide or elemental-form metal. Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 450 from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 100 of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 900 or at one or more other angles (i.e., other than the straight angle).

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming a memory array comprising strings of memory cells comprises forming a conductor tier comprising conductor material on a substrate. Laterally-spaced memory-block regions are formed that individually comprise a vertical stack comprising alternating first tiers and second tiers directly above the conductor tier. Channel-material strings of memory cells extend through the first tiers and the second tiers. Horizontally-elongated lines are formed in the conductor tier between the laterally-spaced memory-block regions. The horizontally-elongated lines are of different composition from an upper portion of the conductor material and comprise metal material. After the horizontally-elongated lines are formed, conductive material is formed in a lower of the first tiers and that directly electrically couples together the channel material of individual of the channel-material strings and the conductor material of the conductor tier.

In some embodiments, a method used in forming a memory array comprising strings of memory cells comprises forming a conductor tier comprising conductor material on a substrate. Horizontally-elongated lines are formed in the conductor tier between what will comprise laterally-spaced memory-block regions there-above. The horizontally-elongated lines are of different composition from an upper portion of the conductor material and comprise metal material. After the horizontally-elongated lines are formed, a stack is formed comprising vertically-alternating first tiers and second tiers above the conductor tier. A lowest of the first tiers comprises sacrificial material. The stack comprises the laterally-spaced memory-block regions having horizontally-elongated trenches there-between that are individually directly above individual of the horizontally-elongated lines in the conductor tier and that extend to the sacrificial material. Channel-material strings extend through the first tiers and the second tiers. Material of the first tiers is of different composition from material of the second tiers. The sacrificial material is isotropically etched from the lowest first tier through the horizontally-elongated trenches. After the isotropically etching, conductive material is formed in the lowest first tier that directly electrically couples together the channel material of individual of the channel-material strings and the conductor material of the conductor tier.

In some embodiments, a memory array comprising strings of memory cells comprises a conductor tier comprising conductor material. Laterally-spaced memory blocks individually comprise a vertical stack comprising alternating insulative tiers and conductive tiers directly above the conductor tier. Channel-material strings of memory cells extend through the insulative tiers and the conductive tiers. Conducting material of a lower of the conductive tiers directly electrically couples together the channel material of individual of the channel-material strings and the conductor material of the conductor tier. Intervening material is laterally-between and longitudinally-along immediately-laterally-adjacent of the memory blocks. The intervening material comprises insulating material. Horizontally-elongated lines are in an upper portion of the conductor tier between the laterally-spaced memory blocks. The horizontally-elongated lines are of different composition from an upper portion of the conductor material and comprise metal material.

In some embodiments, a memory array comprising strings of memory cells comprises a conductor tier comprising conductively-doped polysilicon. Laterally-spaced memory blocks individually comprise a vertical stack comprising alternating insulative tiers and conductive tiers directly above the conductor tier. Channel-material strings of memory cells extend through the insulative tiers and the conductive tiers. A lowest of the conductive tiers comprises conductively-doped polysilicon directly against the conductively-doped polysilicon of the conductor tier and directly against a sidewall of channel material of the channel-material strings in the lowest conductive tier. Intervening material is laterally-between and longitudinally-along immediately-laterally-adjacent of the memory blocks. The intervening material comprises insulating material. Horizontally-elongated lines in an upper portion of the conductor tier are between the laterally-spaced memory blocks. The horizontally-elongated lines comprise at least one of a metal silicide or elemental-form metal.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming a memory array comprising strings of memory cells, comprising:
   forming a conductor tier comprising conductor material on a substrate;
   forming laterally-spaced memory-block regions individually comprising a vertical stack comprising alternating first tiers and second tiers directly above the conductor tier, channel-material strings of memory cells extending through the first tiers and the second tiers;
   forming horizontally-elongated lines in the conductor tier between the laterally-spaced memory-block regions, the horizontally-elongated lines being of different composition from an upper portion of the conductor material and comprising metal material; and
   after forming the horizontally-elongated lines, forming conductive material in a lower of the first tiers and that directly electrically couples together the channel material of individual of the channel-material strings and the conductor material of the conductor tier.

2. The method of claim 1 wherein the horizontally-elongated lines extend laterally into areas of the memory-block regions that are there-above.

3. The method of claim 1 comprising forming the horizontally-elongated lines to comprise an elemental-form metal.

4. The method of claim 3 wherein the forming of the elemental-form metal occurs by a process comprising chemical vapor deposition using a metal halide, the metal of the metal halide comprising the metal of the elemental-form metal.

5. The method of claim 1 comprising forming the horizontally-elongated lines to comprise a metal silicide.

6. The method of claim 5 wherein the upper portion of the conductor material comprises silicon, the forming of the metal silicide occurring by a process comprising:
   depositing an elemental-form metal against the upper portion of the conductor material; and
   annealing the elemental-form metal and the silicon to form the metal silicide.

7. The method of claim 1 comprising forming the horizontally-elongated lines before forming the vertical stack.

8. The method of claim 1 comprising forming the horizontally-elongated lines after forming the vertical stack.

9. The method of claim 1 wherein the horizontally-elongated lines are not as vertically thick as the conductor tier.

10. The method of claim 1 wherein the horizontally-elongated lines are conductive.

11. The method of claim 1 wherein a lowest surface of the channel material of the channel-material-strings is never directly against any of the conductor material of the conductor tier.

12. A method used in forming a memory array comprising strings of memory cells, comprising:
   forming a conductor tier comprising conductor material on a substrate;
   forming horizontally-elongated lines in the conductor tier between what will comprise laterally-spaced memory-block regions there-above, the horizontally-elongated lines being of different composition from an upper portion of the conductor material and comprising metal material;

after forming the horizontally-elongated lines, forming a stack comprising vertically-alternating first tiers and second tiers above the conductor tier, a lowest of the first tiers comprising sacrificial material, the stack comprising the laterally-spaced memory-block regions having horizontally-elongated trenches there-between that are individually directly above individual of the horizontally-elongated lines in the conductor tier and that extend to the sacrificial material, channel-material strings extending through the first tiers and the second tiers, material of the first tiers being of different composition from material of the second tiers;

isotropically etching the sacrificial material from the lowest first tier through the horizontally-elongated trenches; and after the isotropically etching, forming conductive material in the lowest first tier that directly electrically couples together the channel material of individual of the channel-material strings and the conductor material of the conductor tier.

13. The method of claim 12 comprising:

forming masking material directly above the conductor tier prior to forming the horizontally-elongated lines; and forming line-openings through the masking material, individual of the line openings having a longitudinal outline corresponding to that of individual of the horizontally-elongated lines to be formed.

14. The method of claim 13 wherein the masking material comprises silicon dioxide.

15. The method of claim 14 wherein the masking material comprises photoresist above the silicon dioxide.

16. The method of claim 13 wherein the line-openings extend laterally into areas of what will be the memory-block regions that are there-above.

17. The method of claim 12 comprising masking the horizontally-elongated lines with insulative material before forming the sacrificial material.

18. The method of claim 12 comprising forming the horizontally-elongated lines to comprise an elemental-form metal.

19. The method of claim 18 wherein the forming of the elemental-form metal occurs by a process comprising chemical vapor deposition using a metal halide, the metal of the metal halide comprising the metal of the elemental-form metal.

20. The method of claim 12 comprising forming the horizontally-elongated lines to comprise a metal silicide.

21. The method of claim 20 wherein the upper portion of the conductor material comprises silicon, the forming of the metal silicide occurring by a process comprising:

depositing an elemental-form metal against the upper portion of the conductor material; and annealing the elemental-form metal and the silicon to form the metal silicide.

* * * * *